United States Patent
Brunner et al.

(10) Patent No.: US 8,816,375 B2
(45) Date of Patent: Aug. 26, 2014

(54) RADIATION-EMITTING SEMICONDUCTOR BODY, METHOD FOR PRODUCING A RADIATION-EMITTING SEMICONDUCTOR BODY AND RADIATION-EMITTING SEMICONDUCTOR COMPONENT

(75) Inventors: Herbert Brunner, Sinzing (DE); Patrick Ninz, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 15 days.

(21) Appl. No.: 13/698,302

(22) PCT Filed: Jun. 8, 2011

(86) PCT No.: PCT/EP2011/059485
§ 371 (c)(1),
(2), (4) Date: Jan. 28, 2013

(87) PCT Pub. No.: WO2011/154441
PCT Pub. Date: Dec. 15, 2011

(65) Prior Publication Data
US 2013/0134473 A1 May 30, 2013

(30) Foreign Application Priority Data

Jun. 10, 2010 (DE) .......................... 10 2010 023 343

(51) Int. Cl.
*H01L 33/00* (2010.01)

(52) U.S. Cl.
USPC ................... 257/98; 257/88; 257/89; 257/99; 257/100

(58) Field of Classification Search
USPC ........................ 438/22, 28–29, 46–52; 257/99
See application file for complete search history.

(56) References Cited

U.S. PATENT DOCUMENTS

| | | | |
|---|---|---|---|
| 5,779,924 A | 7/1998 | Krames et al. | |
| 6,025,650 A | 2/2000 | Tsuji et al. | |
| 7,687,322 B1 | 3/2010 | Doan et al. | |
| 7,795,054 B2 | 9/2010 | Cho et al. | |
| 2001/0050370 A1 | 12/2001 | Sakamoto et al. | |
| 2002/0052062 A1 | 5/2002 | Sakamoto et al. | |
| 2003/0197191 A1 | 10/2003 | Nitta et al. | |
| 2005/0017252 A1 | 1/2005 | Streubel et al. | |
| 2005/0077529 A1 | 4/2005 | Shen | |
| 2005/0247944 A1 | 11/2005 | Haque et al. | |
| 2006/0043399 A1 | 3/2006 | Miyagaki et al. | |
| 2006/0154393 A1 | 7/2006 | Doan et al. | |
| 2007/0069219 A1 | 3/2007 | Lin et al. | |
| 2008/0142817 A1 | 6/2008 | Ibbetson et al. | |
| 2009/0014735 A1 | 1/2009 | Higashi et al. | |

FOREIGN PATENT DOCUMENTS

| | | |
|---|---|---|
| DE | 10 2006 038 099 A1 | 3/2007 |
| EP | 1 657 757 A2 | 5/2006 |
| JP | 10-004209 A | 1/1998 |
| JP | 2004-235505 A | 8/2004 |
| JP | 2008-147672 A | 6/2008 |
| TW | 200707795 A | 2/2007 |
| TW | 200933755 A | 8/2009 |

*Primary Examiner* — Dung A. Le
(74) *Attorney, Agent, or Firm* — Slater & Matsil, L.L.P.

(57) ABSTRACT

A radiation-emitting semiconductor body is provided which, besides an epitaxial semiconductor layer sequence having an active zone that is suitable for generating electromagnetic radiation, has a carrier layer that is intended to mechanically stabilize the epitaxial semiconductor layer sequence. The semiconductor body furthermore has contact structures for electrical contacting of the semiconductor body, which respectively have a volume region and a surface bonding region. The surface bonding region is formed from a material which is different from the material of the volume region.

17 Claims, 9 Drawing Sheets

RADIATION-EMITTING SEMICONDUCTOR BODY, METHOD FOR PRODUCING A RADIATION-EMITTING SEMICONDUCTOR BODY AND RADIATION-EMITTING SEMICONDUCTOR COMPONENT

This patent application is a national phase filing under section 371 of PCT/EP2011/059485, filed Jun. 8, 2011, which claims the priority of German patent application 10 2010 023 343.9, filed Jun. 10, 2010, each of which is incorporated herein by reference in its entirety.

TECHNICAL FIELD

The invention relates to a radiation-emitting semiconductor body, to a method for producing a radiation-emitting semiconductor body and to a radiation-emitting semiconductor component.

BACKGROUND

Document EP 1 657 757 A2 describes a radiation-emitting semiconductor component comprising a radiation-emitting semiconductor body, which is applied electrically conductively onto a chip carrier by a bonding method, for example ultrasound-friction welding or thermocompression, via backside electrical contacts.

In order to produce the backside contacts, individual conductive contacts are applied successively onto the semiconductor body with the aid of a ball bonder, as described for example in Document U.S. 2005/0247944 A1. This production method is comparatively time-consuming owing to the serial process management.

SUMMARY OF THE INVENTION

In one aspect, the present invention provides a semiconductor body which is suitable for being applied onto a chip carrier by a bonding method, in particular ultrasound-friction welding or thermocompression. In a further aspect, the present invention provides a simplified method for producing such a semiconductor body. A further aspect of the present invention provides a radiation-emitting component having such a radiation-emitting semiconductor body.

A radiation-emitting semiconductor body includes an epitaxial semiconductor layer sequence that has an active zone which is suitable for generating electromagnetic radiation. A carrier layer is intended to mechanically stabilize the epitaxial semiconductor layer sequence. Contact structures electrical contact the semiconductor body, which respectively have a volume region and a surface bonding region. The surface bonding region is furthermore formed from a material which is different from the material of the volume region.

The surface bonding region is suitable in particular for being connected to a chip carrier with the aid of a bonding method, such as ultrasound-friction welding and/or thermocompression. The connection between the chip carrier and the surface bonding region is particularly preferably formed so as to be electrically conductive. The surface bonding region is particularly preferably formed so as to be ultrasound-friction weldable and/or thermocompressible, that is to say it can be connected to the chip carrier by means of ultrasound-friction welding and/or thermocompression.

The contact structures are preferably arranged on the back side of the semiconductor body, the back side lying opposite a radiation-emitting front side of the semiconductor body.

According to one embodiment, each individual contact structure is respectively formed by a single volume region and a single surface bonding region.

The carrier layer is preferably formed so as to be metallic and comprises for example at least one of the following materials or consists of at least one of these materials: nickel, molybdenum, copper. These materials may, for example, be applied onto the epitaxial semiconductor layer sequence by means of a galvanic process.

According to one embodiment of the radiation-emitting semiconductor body, the volume region is formed from the same material as the carrier layer. This is not necessarily intended to mean that the volume regions of the contact structures are formed from the material of the carrier layer, for example by a subtractive method as is described in detail below. Rather, it is also possible for a further layer, which comprises the same material as the carrier layer or consists of the same material, to be applied in a structured way onto the carrier layer in order to form the volume regions of the contact structures.

In this case, it is also possible for the material of the volume region and the material of the carrier layer to differ slightly from one another, for example as a result of production processes which are different or take place successively.

Particularly preferably, the further layer comprises a metallic material, for example nickel, molybdenum or copper, or consists of one of these materials.

According to another embodiment of the radiation-emitting semiconductor body, the contact structures are formed by projections which preferably respectively have a width of between 20 μm and 200 μm, the limits being included.

According to another embodiment of the radiation-emitting semiconductor body, the contact structures are formed by projections which preferably respectively have a height of between 5 μm and 50 μm, the limits being included.

According to another embodiment of the radiation-emitting semiconductor body, the surface bonding region comprises at least one of the following materials or consists of at least one of the following materials: gold, copper, aluminum. Gold is particularly preferably used in this case since its material properties, for example ductility, are particularly suitable for the bonding methods of ultrasound-friction welding and thermocompression. In contrast to other metals, for example copper or aluminum, gold furthermore advantageously has at most a very small oxide layer on its surface, so that a step of removing the oxide layer before the ultrasound-friction welding or thermocompression, as is generally carried out for instance when using copper or aluminum, can be obviated.

If copper or aluminum is used for the surface bonding region, then a subsequent connection step for connecting the semiconductor body to a chip carrier, for example by means of ultrasound-friction welding or thermocompression, is particularly preferably carried out in a protective atmosphere of an inert gas, for example nitrogen or a noble gas.

According to another embodiment of the radiation-emitting semiconductor body, the contact structures are formed by projections, the surface regions respectively extending beyond the volume regions on both sides. The contact structures are in this case for example formed by mushroom-shaped projections, the volume regions forming the stems of the mushrooms and the surface bonding regions forming the caps of the mushrooms. Mushroom-shaped projections can be produced in particular by galvanic deposition of the surface bonding regions by using a photoresist mask, as described in detail below. Since galvanic deposition processes are generally isotropic in nature, cap-shaped structures with rounded edges are formed in this case.

According to another embodiment of the radiation-emitting semiconductor body, the contact structures respectively have a rectangular, square, round or circular base area.

A method for producing a semiconductor body is also disclosed. An epitaxial semiconductor layer sequence has an active zone which is suitable for generating electromagnetic radiation. A carrier layer is applied onto a main side of the epitaxial semiconductor layer sequence. The carrier layer is intended to mechanically stabilize the epitaxial semiconductor layer sequence. A bondable layer is applied and contact structures are formed by photolithography on the carrier layer. The contact structures respectively having a volume region and a surface bonding region.

The epitaxial semiconductor layer sequence is generally grown epitaxially on a suitable growth substrate.

After application of the carrier layer, the growth substrate is generally removed from the epitaxial semiconductor layer sequence, or thinned so that it is not by itself suitable for mechanically stabilizing the epitaxial semiconductor layer sequence.

The growth substrate is removed from the epitaxial semiconductor layer sequence, or correspondingly thinned, for example by polishing, etching or with the aid of a laser lift-off method.

The carrier layer, in particular a metallic carrier layer, is applied onto the epitaxial semiconductor layer sequence for example by means of a galvanic deposition process, sputtering or evaporation.

The bondable layer, in particular when it comprises a metallic material, is likewise for example produced by a galvanic process, or by sputtering or evaporation. The surface bonding regions are preferably formed from the material of the bondable layer.

The bondable layer is particularly preferably formed so as to be ultrasound-friction weldable and/or thermocompressible. In particular, the bondable layer comprises at least one of the following materials or consists of at least one of the following materials: gold, copper, aluminum.

According to one embodiment of the method, a further layer is applied onto the carrier layer, between the carrier layer and the bondable layer. The further layer preferably comprises the same material as the carrier layer. The further layer is particularly preferably formed from the same material as the carrier layer, that is to say the material composition of the further layer does not, within manufacturing tolerances, differ significantly from the material composition of the carrier layer. As a result of different production technologies or two process steps carried out in succession for producing the carrier layer and the further layer, however, slight differences between the material compositions of the two layers may occur.

According to another embodiment of the method, the volume regions of the contact structures are formed from the material of the further layer. This embodiment of the method involves an additive method since the material, from which the volume regions of the contact structures are formed, is provided in the form of an additional layer.

In order to form the contact structures, for example, a photoresist layer which leaves exposed the regions in which the projections of the contact structures are intended to be formed is applied onto the carrier layer. The further layer is subsequently deposited—for example galvanically—so that it fills the free regions within the photoresist layer. In this case, it is possible for the further layer to fill the entire recesses within the photoresist layer fully or only partially. In order to form the surface bonding regions, in this embodiment of the method a further bondable layer is then preferably deposited, which likewise follows the structuring dictated by the photoresist layer. Finally, the photoresist layer is removed so that only the contact structures in the form of projections, each with a volume region and a surface bonding region, remain on the carrier layer.

As an alternative to the additive method described above, a subtractive method may also be carried out. In the subtractive method, the volume regions of the contact structures are formed directly from the material of the carrier layer, for example by etching.

A particular advantage of the method described here is that it can be carried out on the wafer level, that is to say before separating the semiconductor bodies. This allows simple and rapid production of the contact structures. Furthermore, owing to the photostructuring, the contact structures can be produced in a parallel process.

The contact structures obtained furthermore have good thermal and electrical conductivity and can be obtained in few process steps. Furthermore, merely a small thermal input into the semiconductor body, and particularly into the semiconductor layer sequence comprising the active radiation-generating zone, takes place in the method for producing the contact structures. In addition, the production method proposed here generally makes subsequent cleaning of the semiconductor body superfluous.

According to another embodiment, the bondable layer is applied in direct contact onto the carrier layer.

A radiation-emitting semiconductor component may, for example, be produced by applying one of the radiation-emitting semiconductor bodies described above onto a chip carrier. The semiconductor body is particularly preferably applied on the chip carrier by means of ultrasound-friction welding or thermocompression. To this end, the carrier preferably has contact regions which are intended to be connected to the contact structures of the semiconductor body. The contact regions preferably have a metallization which is ultrasound-friction weldable and/or thermocompressible. To this end, for example, metallization which consists of one of the following materials or comprises one of the following materials is suitable: gold, copper, aluminum.

Advantageously, a plurality of semiconductor bodies may be fastened by the bonding methods of ultrasound-friction welding or thermocompression, for example on a carrier, at smaller distances from one another than for instance with adhesives or solders.

According to another embodiment of the radiation-emitting semiconductor component, an electrically insulating filler material is introduced at least between the contact structures. The filler material is preferably introduced between the contact structures after application onto a carrier.

BRIEF DESCRIPTION OF THE DRAWINGS

Other advantageous embodiments and refinements of the invention may be found in the following exemplary embodiments described in connection with the figures.

Elements which are the same or of the same type, or have the same effect, are provided with the same references in the figures. The figures and the size ratios of the elements represented in the figures to one another are not to be regarded as true to scale. Rather, individual elements, in particular layer thicknesses, may be represented exaggeratedly large for better representation and/or for better understanding.

DETAILED DESCRIPTION OF ILLUSTRATIVE EMBODIMENTS

Figure 1A:
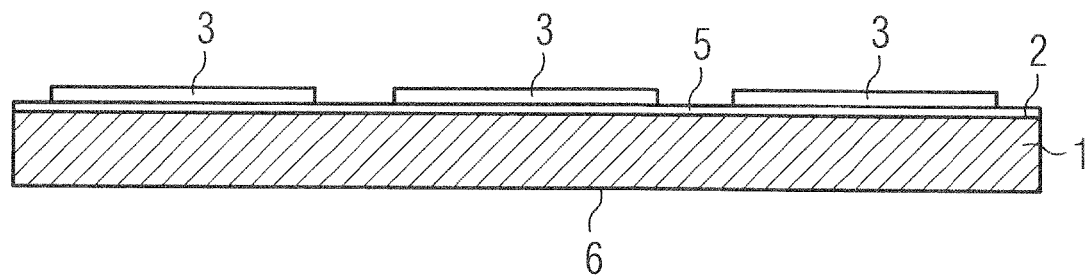
FIGS. 1A to 1G show schematic sectional representations of a wafer assemblage during various method steps according to a first exemplary embodiment.

FIG. 1A shows a carrier layer 1, on the first main side 2 of which an epitaxial semiconductor layer sequence 3 is arranged. The carrier layer 1 mechanically stabilizes the semiconductor layer sequence 3. The epitaxial semiconductor layer sequence 3 in the present case is already structured into chip regions, of which each chip region is subsequently part of a finished semiconductor body. The epitaxial semiconductor layer sequence 3 has an active zone 4 (not represented in FIGS. 1A to 1G), which is suitable for generating electromagnetic radiation.

Particularly preferably, the further layer 10 is formed so as to be metallic and comprises the same material as the carrier layer 1, for example nickel, molybdenum, copper.

The carrier layer 1 in the present case is formed so as to be metallic and comprises for example nickel, molybdenum, copper.

The active zone 4 preferably comprises a pn junction, a double heterostructure, a single quantum well or particularly preferably a multiple quantum well structure (MQW) for generating radiation. The term quantum well structure does not in this case involve any indication of the dimensionality of the quantization. It therefore covers inter alia quantum wells per se, quantum wires, quantum dots and any combination of these structures.

A layer 5 is arranged between the carrier layer 1 and the structured epitaxial semiconductor layer sequences 3. This layer 5 may, for example, be a bonding layer for connecting the epitaxial semiconductor layer sequence 3 to the carrier layer 1, which comprises for instance a solder or an adhesive. Furthermore, the layer 5 may also be a metallic starter layer if the carrier layer 1 is grown galvanically.

Figure 1B:
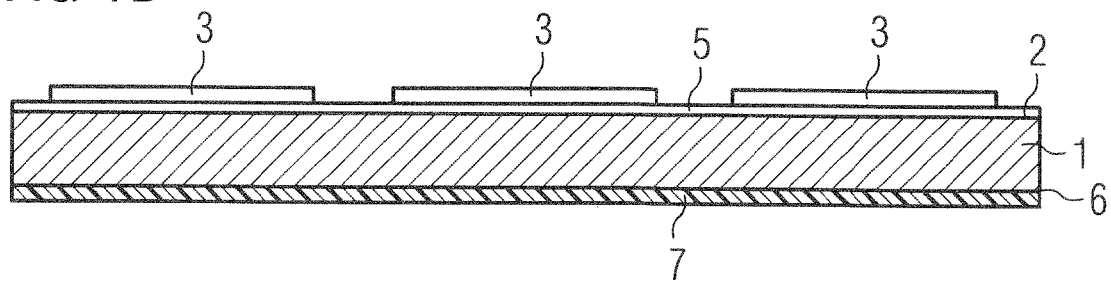

As represented by way of example in FIG. 1B, a photoresist layer 7 is applied onto the second main side 6 of the carrier layer 1, which lies opposite the first main side 2.

Figure 1C:
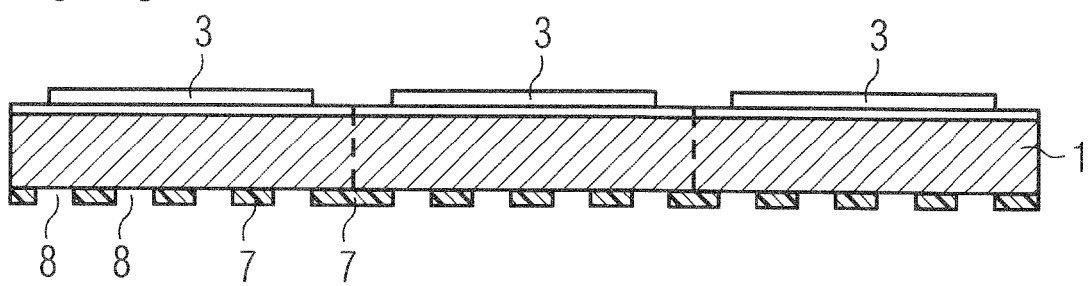

The photoresist layer 7 is now structured so that openings 8 are formed in the photoresist layer 1, and pass entirely through the photoresist layer 7 (FIG. 1C). The openings 8 in the photoresist layer 7 dictate the shape of the contact structures 9 formed subsequently.

Figure 1D:
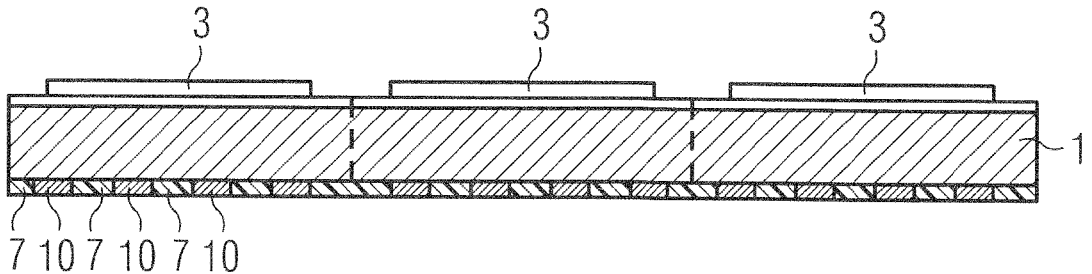

In a next method step, which is represented in FIG. 1D, a further layer 10 is deposited over the photoresist layer 7, the material of the further layer 10 filling the openings 8 in the photoresist layer 7 fully as far as the edge of the photoresist layer 7. The further layer 10 is therefore applied onto the carrier layer 1 in such a way that it is structured according to the photoresist layer 7. The volume regions 11 of the contact structures 9 are formed from the material of the metallic layer 10. The method according to the exemplary embodiment of FIGS. 1A to 1G is therefore an additive method.

Particularly preferably, the further layer 10 is formed so as to be metallic and comprises the same material as the carrier layer 1, for example nickel, molybdenum, copper.

Figure 1E:
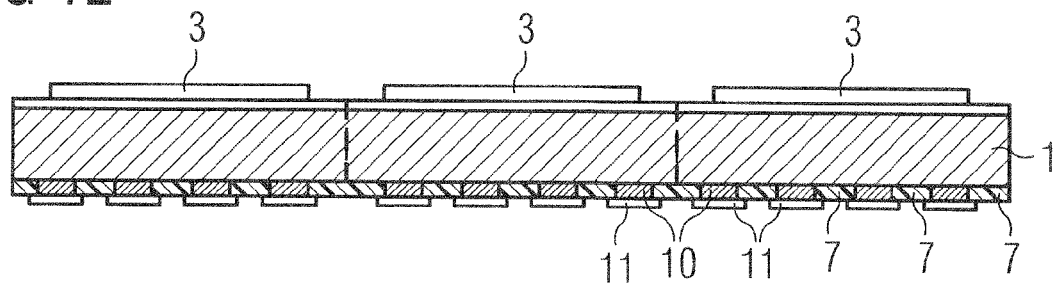

In a further method step, a bondable layer 11 is now applied onto the further layer 10 (FIG. 1E). The bondable layer 11 is preferably formed so as to be ultrasound-friction weldable and/or thermocompressible and comprises one of the following materials: gold, copper, aluminum. The application of the bondable layer 11 is carried out, for example, by a galvanic deposition process. In this case, the surface of the further layer 10 forms a starting point for the deposition of the bondable layer 11, so that cap-shaped structures are formed starting from the underlying structured further layer 10.

Figure 1F:
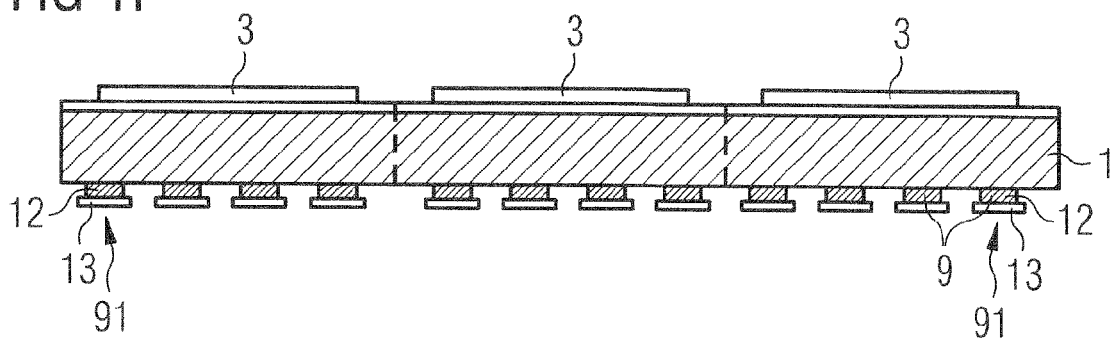

In a further step, which is schematically represented in FIG. 1F, the photoresist layer 7 is removed. In this way, contact structures 9 which each comprise a volume region 12 and a surface bonding region 13 are formed on the second main side 6 of the carrier layer 1. The surface region 13 is in this case formed from the material of the bondable layer 11. If the bondable layer 11 is ultrasound-friction weldable and/or thermocompressible, then the surface region 13 is therefore also ultrasound-friction weldable and/or thermocompressible.

Figure 1G:
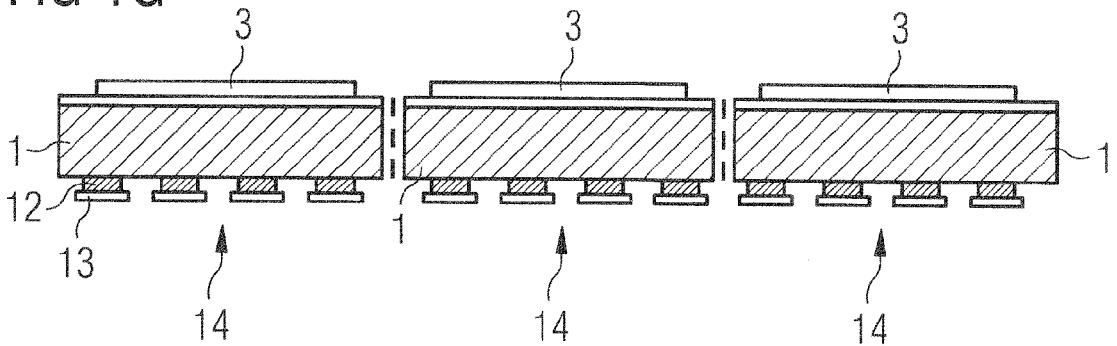

In a next step, the wafer assemblage is separated into individual semiconductor bodies 14 (FIG. 1G).

Figure 2:
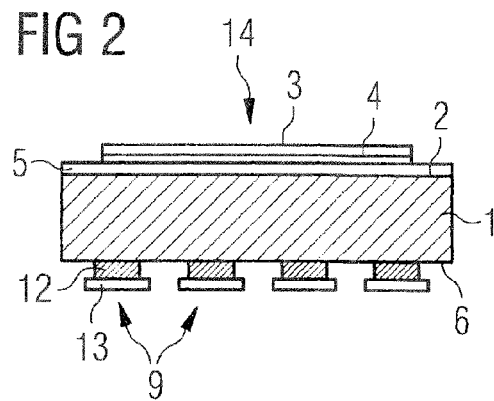
FIG. 2 shows a schematic sectional representation of a semiconductor body according to one exemplary embodiment.

With the method according to FIGS. 1A to 1G, for example, a radiation-emitting semiconductor body 14 as schematically represented in FIG. 2 can be produced.

The semiconductor body 14 according to the exemplary embodiment of FIG. 2 has an epitaxially grown semiconductor layer sequence 3, which comprises an active zone 4. The epitaxial semiconductor layer sequence 3 is arranged on the first main side 2 of a carrier layer 1, the carrier layer 1 being used to mechanically stabilize the epitaxial semiconductor layer sequence 3. A layer 5 is arranged between the epitaxial semiconductor layer sequence 3 and the carrier layer 1.

Contact structures 9 are arranged on the second main side 6 of the carrier layer 1. The contact structures 9 comprise volume regions 12, these being formed from the same material as the carrier layer 1. The contact structures 9 furthermore comprise surface bonding regions 13, which are preferably formed so as to be ultrasound-friction weldable and/or thermocompressible. The surface bonding region 13 of a contact structure 9 in the present case is arranged in direct contact with the volume region 12. The volume regions 12 of the contact structures 9 are furthermore arranged in direct contact with the carrier layer 1.

In the semiconductor body 14 according to FIG. 2, the contact structures 9 are formed by mushroom-shaped projections, the volume region 12 forming the stem of the mushroom and the surface bonding region 13 forming the cap of the mushroom. The surface bonding region 13 therefore extends laterally beyond the volume region 12 and has rounded edges.

Figure 3A:
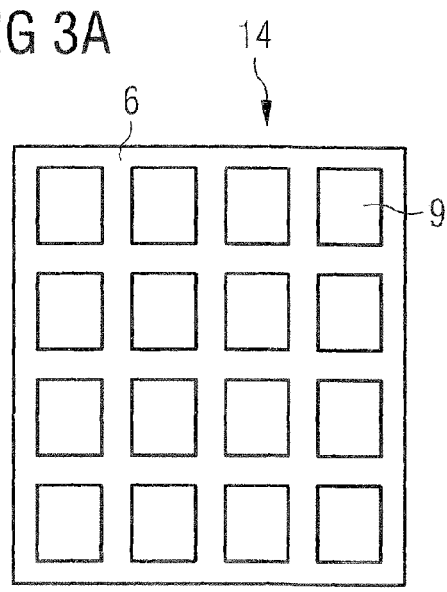
FIGS. 3A and 3B respectively show a schematic plan view of a semiconductor body according to two different exemplary embodiments.
Figure 3B:
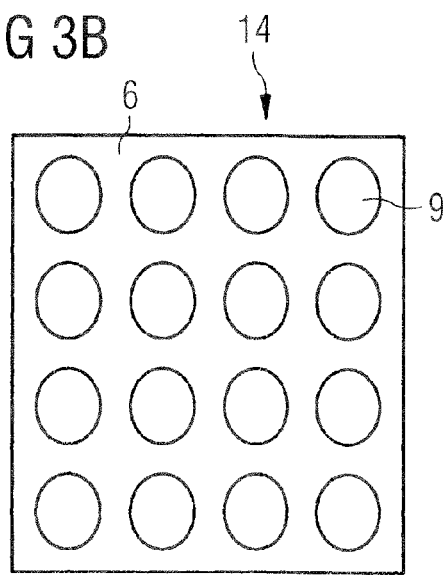

As represented by way of example in the plan view of a semiconductor body in FIG. 3A, the base area of the contact structures 9 may respectively be formed so as to be rectangular or square. Furthermore, the base area of the contact structures 9 may also be formed so as to be round or circular (FIG. 3B).

Another exemplary embodiment of an additive method for producing the contact structures 9 will be described below with the aid of FIGS. 4A to 4F. The method steps according to FIGS. 4A to 4C correspond essentially to the method steps according to FIGS. 1A to 1C.

Figure 4A:
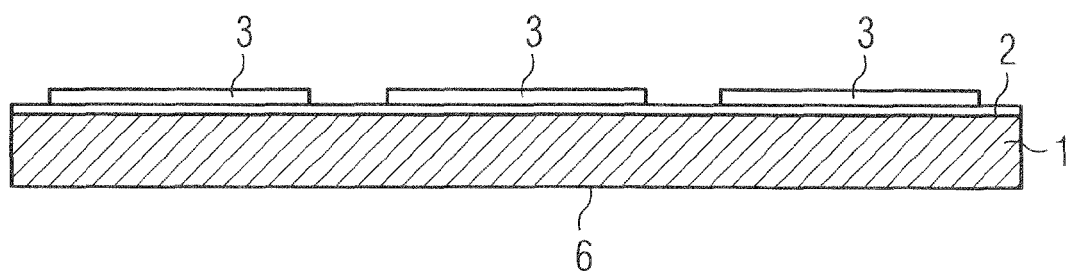
FIGS. 4A to 4F show schematic sectional representations of a wafer assemblage during various method steps according to another exemplary embodiment.
Figure 4B:
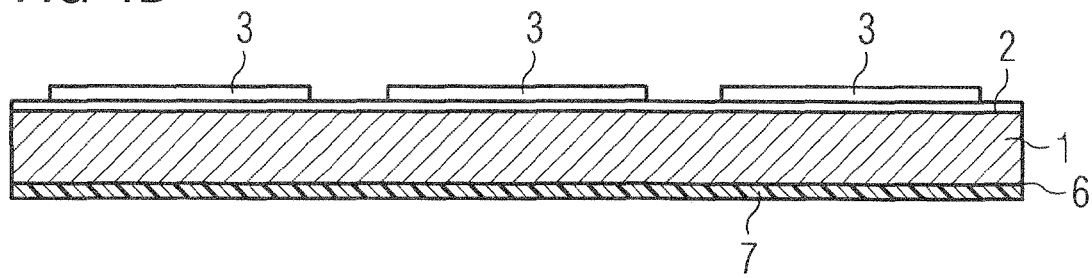
Figure 4C:
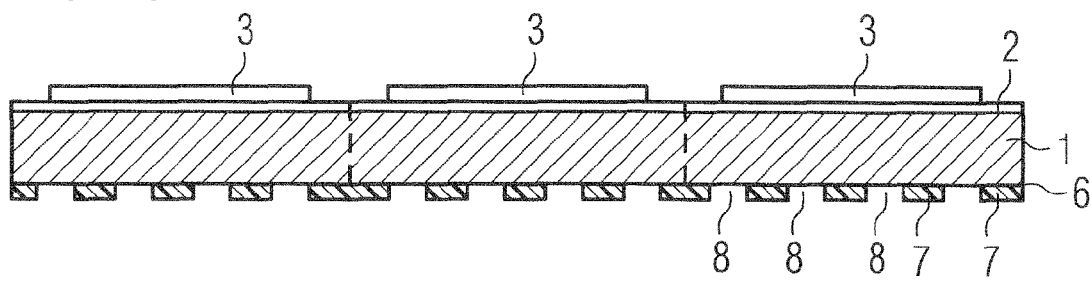
Figure 4D:
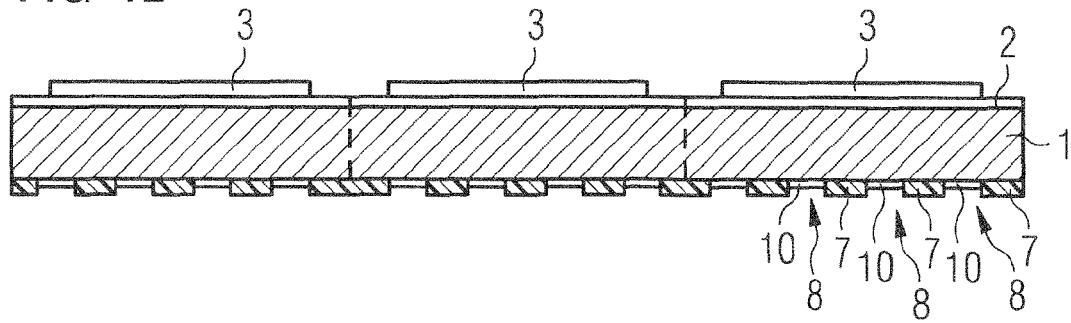
Figure 4E:
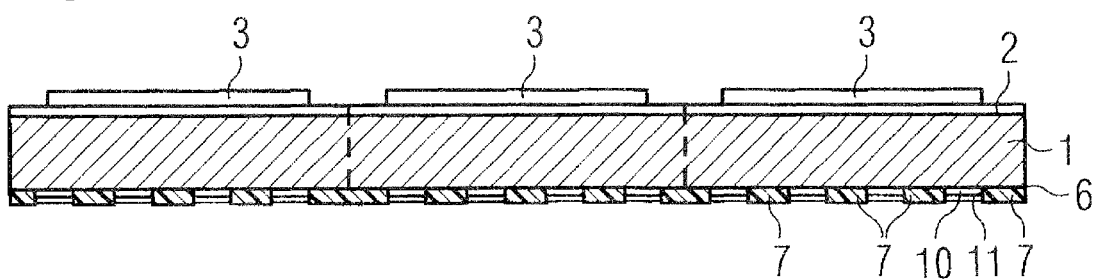
Figure 4F:
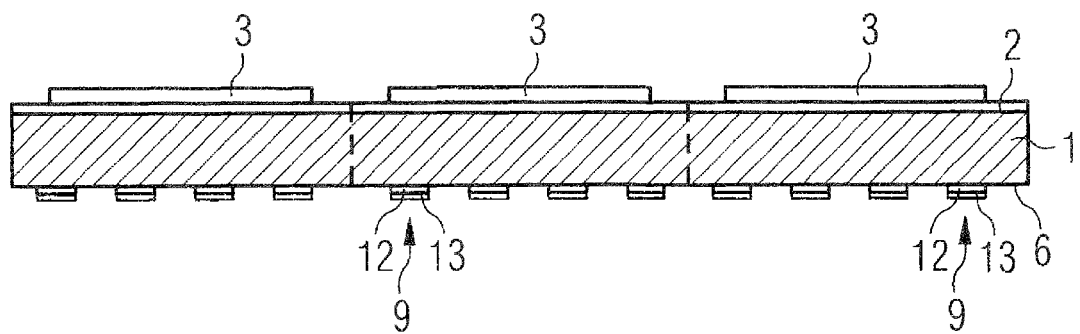

In contrast to the method according to the exemplary embodiment of FIGS. 1A to 1G, however, the further layer 10 is deposited on the structured photoresist layer 7 in such a way that its material only partially fills the openings 8 in the photoresist layer 7 (FIG. 4D). In a subsequent step, the bondable layer 11 is now applied; this also does not entirely fill the remaining height of the openings 8 (FIG. 4E).

In a further step, the photoresist layer 7 is now removed (FIG. 4F) and the semiconductor bodies 14 are separated (not shown).

In this way, contact structures 9 in which the surface bonding regions 13 end laterally flush with the volume regions 12 are formed, in contrast to the contact structures 9 according to FIG. 2.

An exemplary embodiment of a subtractive method will be explained in more detail below with the aid of FIGS. 5A to 5E.

Figure 5A:
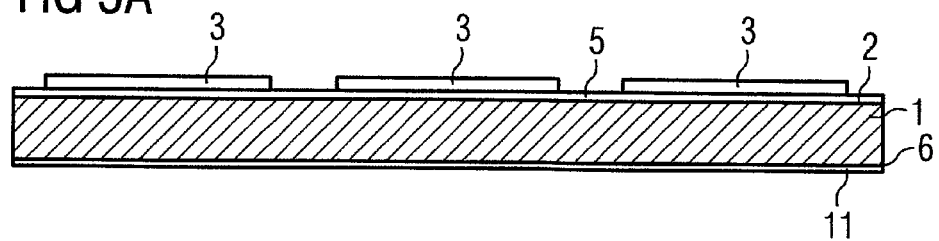
FIGS. 5A to 5E show schematic sectional representations of a wafer assemblage during various method steps according to another exemplary embodiment.

FIG. 5A shows an epitaxial semiconductor layer sequence 3, already structured into individual chip regions, which is arranged on a carrier layer 1. A layer 5, which may for example be a reflective layer, is arranged between the carrier layer 1 and the epitaxial semiconductor layer sequence 3.

Figure 5B:
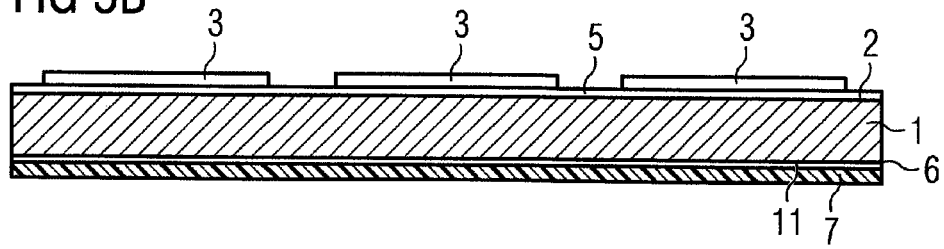
Figure 5C:
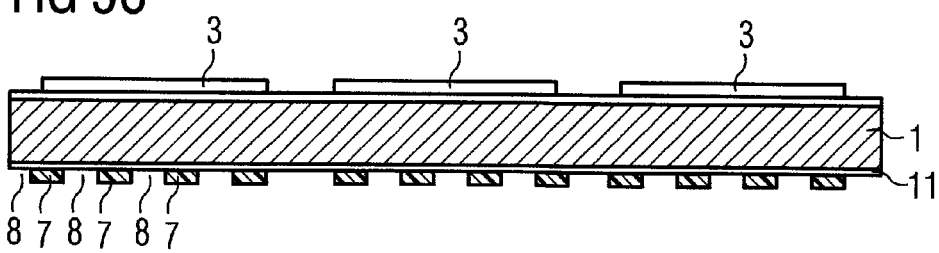

In contrast to FIGS. 1A and 4A, in the wafer assemblage according to FIG. 5A a bondable layer 11, for example of gold, is applied unstructured on the second main side 6 of the carrier layer 1. As can be seen in FIG. 5B, a photoresist layer 7 is applied onto the bondable layer 11 and is subsequently structured according to the desired contact structures 9 (FIG. 5C). The photoresist layer 7 in this case has openings 8, corresponding to the contact structures 9 to be produced subsequently, which pass entirely through the photoresist layer 7.

Figure 5D:
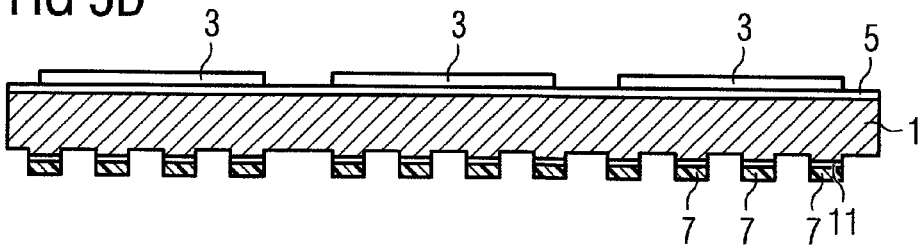
Figure 5E:
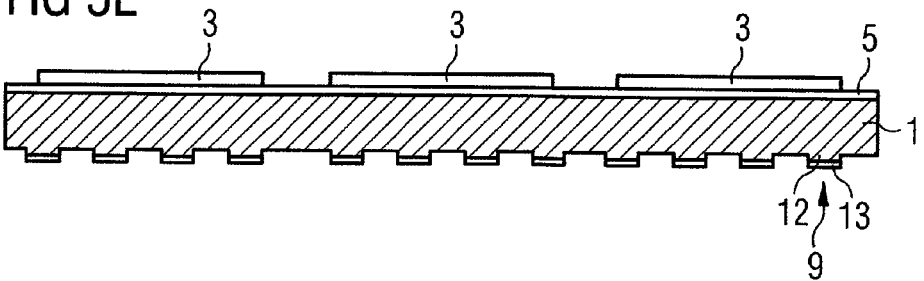

In a next step, the bondable layer 11 and a part of the carrier layer 1 are structured according to the structured photoresist layer 7, for example by means of wet chemical etching (FIG. 5D). The photoresist layer 7 is then removed (FIG. 5E).

This method also forms contact structures 9, each of which has a volume region 12 and a surface bonding region 13. The surface bonding region 13 in this case ends laterally flush with the volume region 12.

Another exemplary embodiment of a subtractive method will be described below with the aid of FIGS. 6A to 6H. The method steps according to FIGS. 6A to 6C correspond essentially to the method steps according to FIGS. 1A to 1C.

Figure 6A:
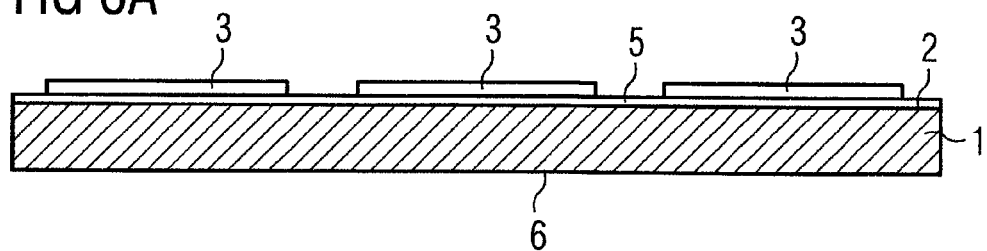
FIGS. 6A to 6H show schematic sectional representations of a wafer assemblage during various method steps according to another exemplary embodiment.
Figure 6B:
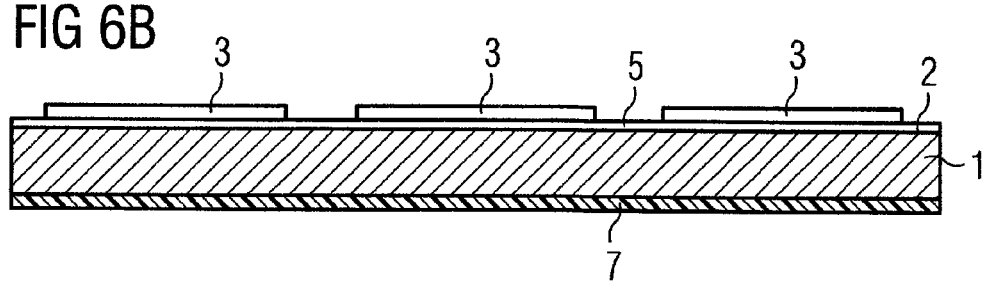
Figure 6C:
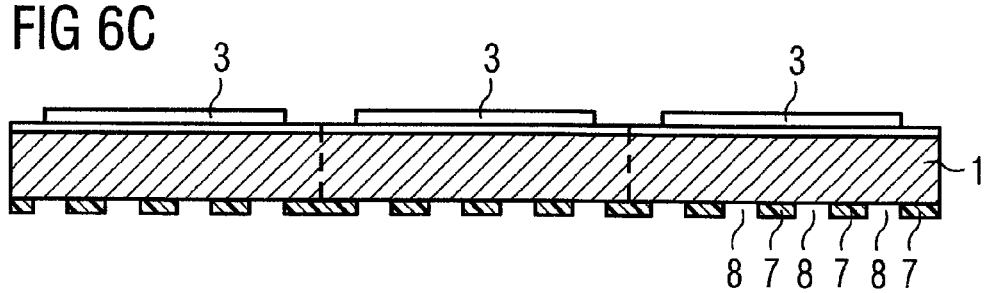
Figure 6D:
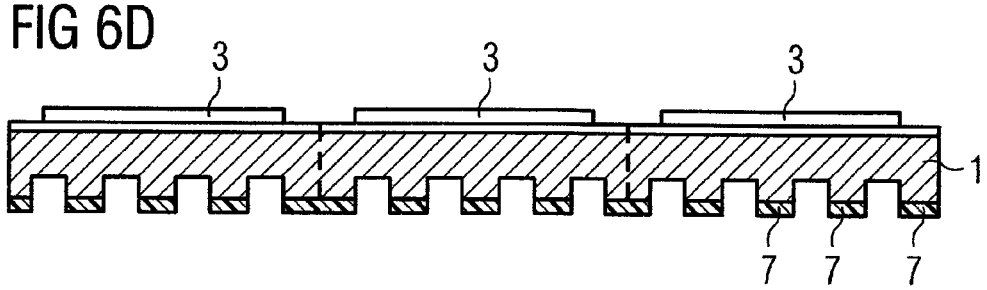
Figure 6E:
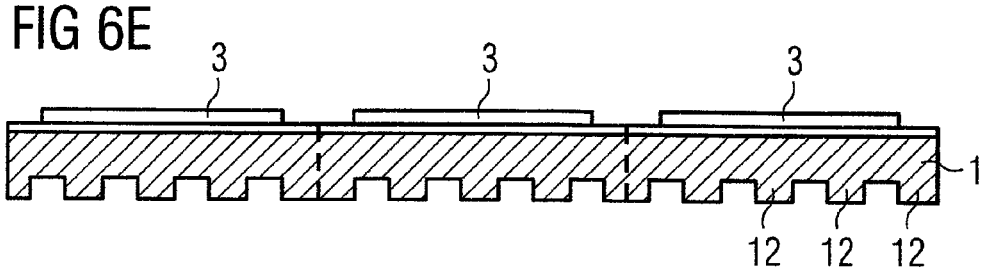

In contrast to the method according to FIGS. 1A to 1G, however, a further layer 10 is not applied after structuring the photoresist layer 7; rather, the material of the carrier layer 1 itself is removed inside the openings 8 of the photoresist layer 7, for example by means of etching (FIG. 6D). After removal of the photoresist layer 7, volume regions 12 of the future contact structures 9 are thereby formed, as shown in FIG. 6E.

Figure 6F:
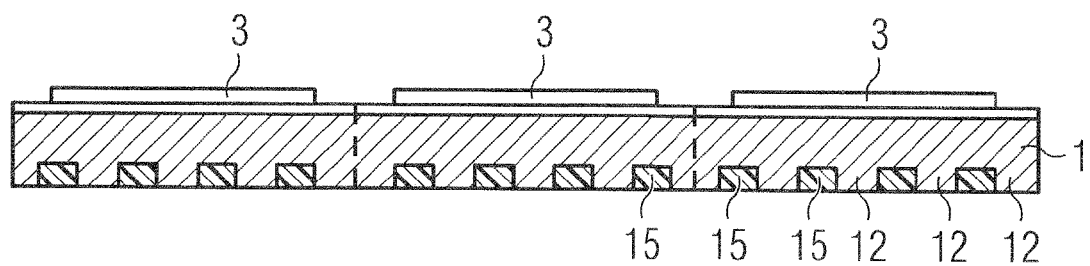

In a next step, a further photoresist layer 15 is applied in a structured way onto the second main side 6 of the carrier layer 1 so that the material of the further photoresist layer 15 entirely fills the indentations between the volume regions 12 of the contact structures 9 (FIG. 6F).

Figure 6G:
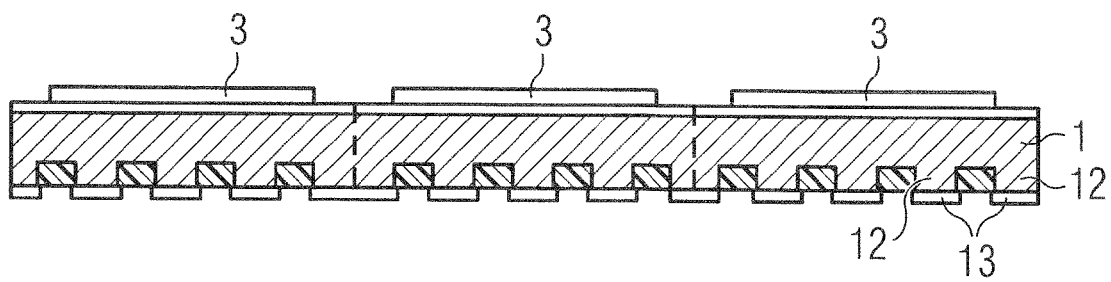

In a next step, a bondable layer 11 is now applied on the further photoresist layer 15, for example by means of galvanic deposition (FIG. 6G).

Figure 6H:
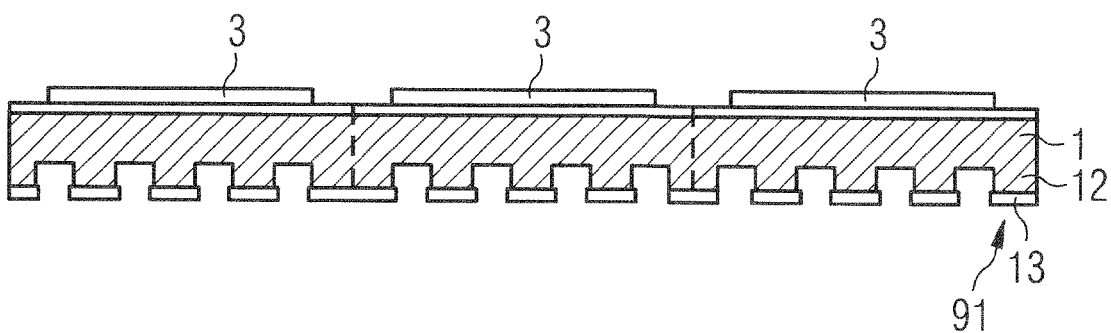

Contact structures 9 are therefore formed after removal of the second photoresist layer 15, each contact structure 91 being formed by a volume region 12 and a surface bonding region 13. The volume region 12 is in this case formed from the material of the carrier layer 1, and the surface bonding region 13 preferably comprises a thermocompressible and/or ultrasound-friction weldable material which is preferably different from the material of the volume region 12 (FIG. 6H).

Figure 7A:
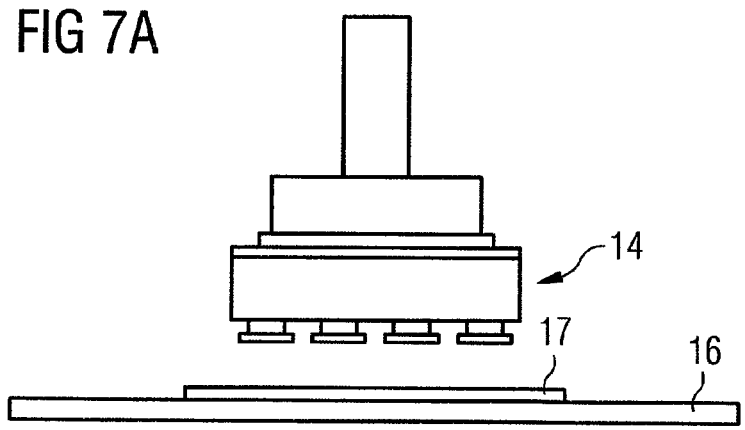
FIGS. 7A to 7D show schematic sectional representations of a radiation-emitting semiconductor component during various method steps according to an exemplary embodiment.

In the method according to the exemplary embodiment of FIGS. 7A to 7D, a chip carrier 16 is provided in a first step, and a metallization which is preferably ultrasound-friction weldable and/or thermocompressible is applied onto this inside a contact region 17 (FIG. 7A).

Figure 7B:
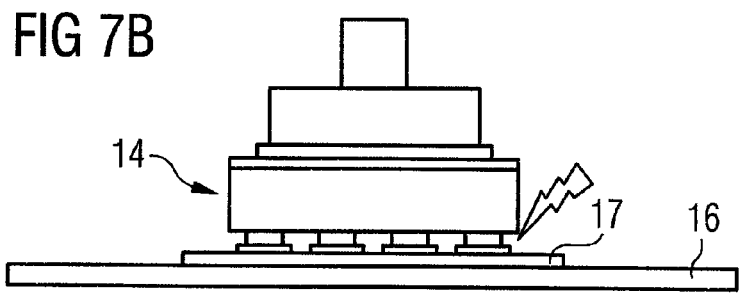
Figure 7C:
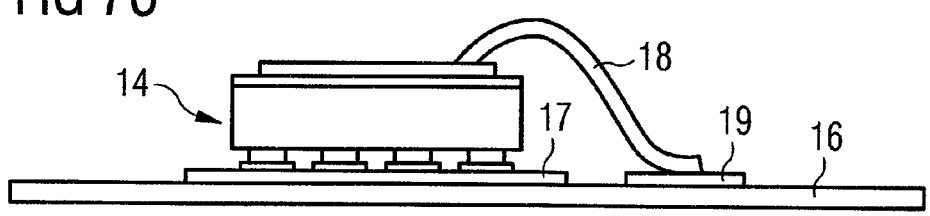

In a second step, a semiconductor body 14, as may be produced for example by one of the methods described above, is electrically conductively connected to the contact region 17 of the chip carrier 16 by a bonding method, such as ultrasound welding and/or thermocompression, via its backside contact structures 9 which preferably have an ultrasound-friction weldable and/or thermocompressible surface bonding region 13 (FIG. 7B). With the aid of a bonding wire 18, the semiconductor body 14 is electrically contacted on the front side with a bonding pad 19 on the chip carrier 16 (FIG. 7C).

Figure 7D:
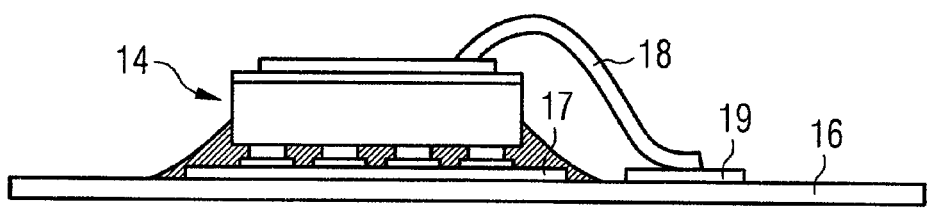

In a further step, as shown by way of example in FIG. 7D, a filler material 20 is introduced between the chip carrier 16 and the projections which form the contact structures 9. For example, one of the following materials may be used as the filler material 20: epoxy resins which are for example thermally curable, silicones, hybrid materials which comprise for example epoxy resins and silicones. According to one embodiment, the filler material 20 comprises a filler such as, for example, titanium oxide.

The description with the aid of the exemplary embodiments does not restrict the invention to these exemplary embodiments. Rather, the invention comprises any new feature and any combination of features, which includes in particular any combination of features in the patent claims, even if this feature or this combination per se is not specifically indicated in the patent claims or exemplary embodiments.

The invention claimed is:

1. A radiation-emitting semiconductor body, comprising:
    an epitaxial semiconductor layer sequence having an active zone that is suitable for generating electromagnetic radiation;
    a carrier layer configured to mechanically stabilize the epitaxial semiconductor layer sequence, wherein the carrier layer comprises a metallic material; and
    contact structures for electrical contacting of the semiconductor body, each contact structure having a volume region and a surface bonding region, the surface bonding region being formed from a material that is different from the material of the volume region.

2. The radiation-emitting semiconductor body according to claim 1, wherein the volume region is formed from the same material as the carrier layer.

3. The radiation-emitting semiconductor body according to claim 1, wherein the metallic material is selected from the group consisting of nickel, molybdenum and copper.

4. The radiation-emitting semiconductor body according to claim 1, wherein the surface bonding regions comprise at least one material selected from the group consisting of gold, copper and aluminum.

5. The radiation-emitting semiconductor body according to claim 1, wherein the contact structures are formed by projections, which respectively have a width of between 20 µm and 200 µm and a height of between 5 µm and 50 µm, the limits being included.

6. The radiation-emitting semiconductor body according to claim 1, wherein the contact structures are formed by projections, which respectively have a width of between 20 µm and 200 µm, the limits being included.

7. The radiation-emitting semiconductor body according to claim 1, wherein the contact structures are formed by projections, which respectively have a height of between 5 µm and 50 µm, the limits being included.

8. The radiation-emitting semiconductor body according to claim 1, wherein each contact structures is formed by a projection, the respective surface bonding regions extending beyond the volume regions on both sides.

9. The radiation-emitting semiconductor body according to claim 1, wherein the surface bonding regions are formed so as to be ultrasound-friction weldable and/or thermocompressible.

10. A method for producing a radiation-emitting semiconductor body, the method comprising:
    providing an epitaxial semiconductor layer sequence having an active zone that is suitable for generating electromagnetic radiation;
    applying a carrier layer onto a main side of the epitaxial semiconductor layer sequence, the carrier layer being configured to mechanically stabilize the epitaxial semiconductor layer sequence, wherein the material of the carrier layer is metallic material;
    applying a bondable layer; and
    forming contact structures by photolithography on the carrier layer, the contact structures respectively having a volume region and a surface bonding region.

11. The method according to claim 10, further comprising applying a further layer of the same material as the carrier layer between the carrier layer and the bondable layer.

12. The method according to claim 11, wherein the volume regions of the contact structures are formed from the material of the further layer.

13. The method according to claim 10, wherein the volume regions of the contact structures are formed from the material of the carrier layer.

14. The method according to claim 13, wherein the bondable layer is applied in direct contact onto the carrier layer.

15. The method according claim 10, wherein the surface bonding region and/or the bondable layer is/are formed so as to be ultrasound-friction weldable and/or thermocompressible.

16. A radiation-emitting semiconductor component comprising a chip carrier and a radiation-emitting semiconductor body according to claim 1 that is applied onto the chip carrier.

17. The radiation-emitting semiconductor component according to claim 16, wherein the semiconductor body is applied onto the chip carrier by ultrasound-friction welding or thermocompression.

* * * * *